United States Patent
Ng et al.

(10) Patent No.: US 7,397,273 B1
(45) Date of Patent: Jul. 8, 2008

(54) BIDIRECTIONAL LOGIC ISOLATION MULTIPLEXING WITH VOLTAGE LEVEL TRANSLATION CAPABILITY FOR OPEN-DRAIN CIRCUITRY

(75) Inventors: Mark Men Bon Ng, Milpitas, CA (US); Scott Te-Sheng Lien, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 125 days.

(21) Appl. No.: 11/484,256

(22) Filed: Jul. 11, 2006

(51) Int. Cl.
G06F 7/38 (2006.01)
H03K 19/173 (2006.01)
(52) U.S. Cl. .............................. 326/38; 326/83; 326/86; 326/62
(58) Field of Classification Search .................. 326/86, 326/38, 83, 85, 62; 710/305
See application file for complete search history.

(56) References Cited

U.S. PATENT DOCUMENTS 3,795,901 A * 3/1974 Boehm et al. ............... 710/305
4,713,557 A * 12/1987 Carter ......................... 326/86
7,129,747 B1 * 10/2006 Jang et al. ..................... 326/38

OTHER PUBLICATIONS

Signetics; "8×41 Autodirectional Bus Transceiver"; Data sheet; downloaded May 11, 2006; pp. 7-17 thru 7-21.

Texas Instruments; "High Performance Analog Optimized for DaVinci™ Technology"; downloaded from http://www.ti.com/corp/docs/landing/hpadavinci/sp_logic_sn74vca406.htm on May 17, 2006; pp. 1-2.

SanDisk Corporation; "Supporting Two SD Devices with a Single SD Bus Host Controller"; Application Note, version 1.0; Document No. 80-36-00458; Oct. 18, 2005; pp. 1-7.

Maxim; Maxim MAX 3000 family Data sheet; "+1.2V to +5.5V, ±15kV ESD-Protected, 0.1µA, 35 Mbps, 8-Channel Level Translators"; Copyright 2005 Maxim Integrated products; pp. 1-25.

* cited by examiner

*Primary Examiner*—Marvin M. Lateef
*Assistant Examiner*—Adam Houston
(74) *Attorney, Agent, or Firm*—W. Eric Webostad

(57) ABSTRACT

Voltage level translation for open-drain circuitry is described. A logic isolation circuit includes a first buffer circuit configured for being switched between a first voltage transferable state and a first voltage non-transferable state. A first latch circuit is configured for being switched between a first reset state and a first non-reset state, the first reset state for setting the first latch circuit to a first reset condition. A second buffer circuit and second latch circuit are configured like the first buffer circuit and the first latch circuit. First and second input/output nodes are coupled to receive first and second logic level voltages, respectively. The first logic level voltage and the second logic level voltage are both for a same logic state, but the second logic level voltage is significantly greater than the first logic level voltage.

20 Claims, 6 Drawing Sheets

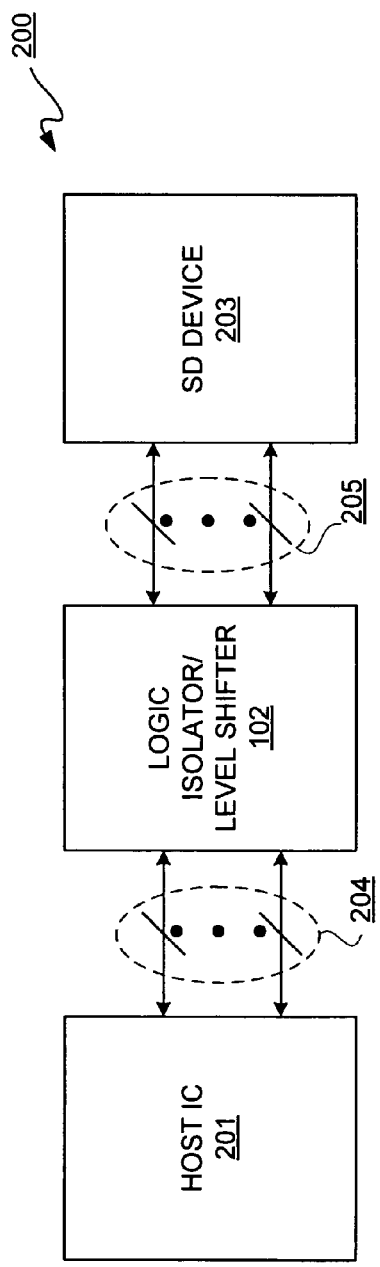
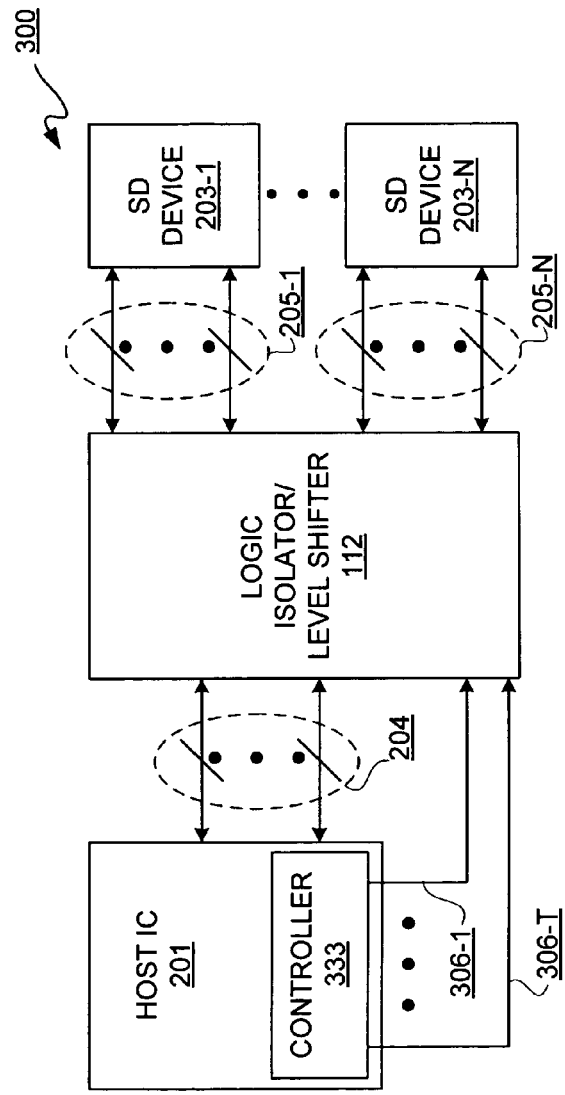
FIG. 2
FIG. 3

BIDIRECTIONAL LOGIC ISOLATION MULTIPLEXING WITH VOLTAGE LEVEL TRANSLATION CAPABILITY FOR OPEN-DRAIN CIRCUITRY

FIELD OF THE INVENTION

One or more aspects of the invention relate generally to integrated circuits and, more particularly, to bidirectional logic isolation multiplexing with voltage level translation capability for open-drain circuitry.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

Voltage level translators or transceivers may be used for having integrated circuits of different logic high voltage levels communicate with one another. These voltage level transceivers or translators provide voltage level shifting, and thus may more generally be thought of as "level shifters."

There are various known applications where level shifters may be employed. Conventionally, level shifters implemented with "push-pull" input/output drivers are used for communicating between two integrated circuits, for example such as where a host device communicates with a peripheral device.

More recently, "open-drain" circuitry is being used instead of push-pull circuitry for input/output circuitry. Examples of open-drain configurations include Secure Digital ("SD"), MMC, I2C, SPI, and Microwire, among other known open-drain configurations. More particularly, in the SD segment, a host device, such as a microprocessor, may communicate with an SD or SDIO peripheral device. By peripheral device, it is meant an integrated circuit external to the host integrated circuit. Because host and peripheral integrated circuits may have different logic high voltage levels, voltage level translation and/or logic isolation between such host and peripheral device may be needed. Additionally, a host device, such as a microprocessor, may only have one controller for communicating with one peripheral device at a time.

Accordingly, it would be both desirable and useful to provide level shifting means for open-drain uses. Moreover, it would be additionally both desirable and useful to provide level shifting means for open-drain uses that allows a single controller to multiplex with more than one peripheral device. Furthermore, it would be both desirable and useful to provide a bidirectional multiplexing means that allows a single controller to communicate with more than one open-drain peripheral device with or without level shifting for logical isolation.

SUMMARY OF THE INVENTION

One or more aspects of the invention generally relate to integrated circuits and, more particularly, to bidirectional logic isolation multiplexing with voltage level translation capability for open-drain circuitry.

An aspect of the invention is a logic isolation circuit. A first buffer circuit is configured for being switched between a first voltage transferable state and a first voltage non-transferable state. A first latch circuit is configured for being switched between a first reset state and a first non-reset state, the first reset state for setting the first latch circuit to a first reset condition. A first input/output node is coupled to receive a first logic level voltage. A second buffer circuit is configured for being switched between a second voltage transferable state and a second voltage non-transferable state. A second latch circuit is configured for being switched between a second reset state and a second non-reset state, the second reset state for setting the second latch circuit to a second reset condition. A second input/output node coupled to receive a second logic level voltage. The first logic level voltage and the second logic level voltage are both for a same logic state.

Another aspect of the invention is a system for bidirectional communication between a host integrated circuit and one or more peripheral integrated circuits. A logic isolator is coupled between the host integrated circuit and the one or more peripheral integrated circuits. The host integrated circuit is configured to provide a select signal for selecting one of the one or more peripheral integrated circuits for communication. The logic isolator is configurable to be in a first transfer mode for transferring first information from the host integrated circuit to the one of the one or more peripheral integrated circuits. The logic isolator is put in the first transfer mode responsive to a leading portion of the first information. The logic isolator is further configurable to be in a second transfer mode, which is mutually exclusive with the first transfer mode, for transferring second information from the one of the one or more peripheral integrated circuits to the host integrated circuit. The logic isolator is put in the second transfer mode responsive to a leading portion of the second information. The logic isolator is bidirectional responsive to the leading portion respectively associated with the first information and the second information.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 2 is a block diagram depicting an exemplary embodiment of a level shifter system.

FIG. 3 is a block diagram depicting an alternative exemplary embodiment of a level shifter system.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1B:
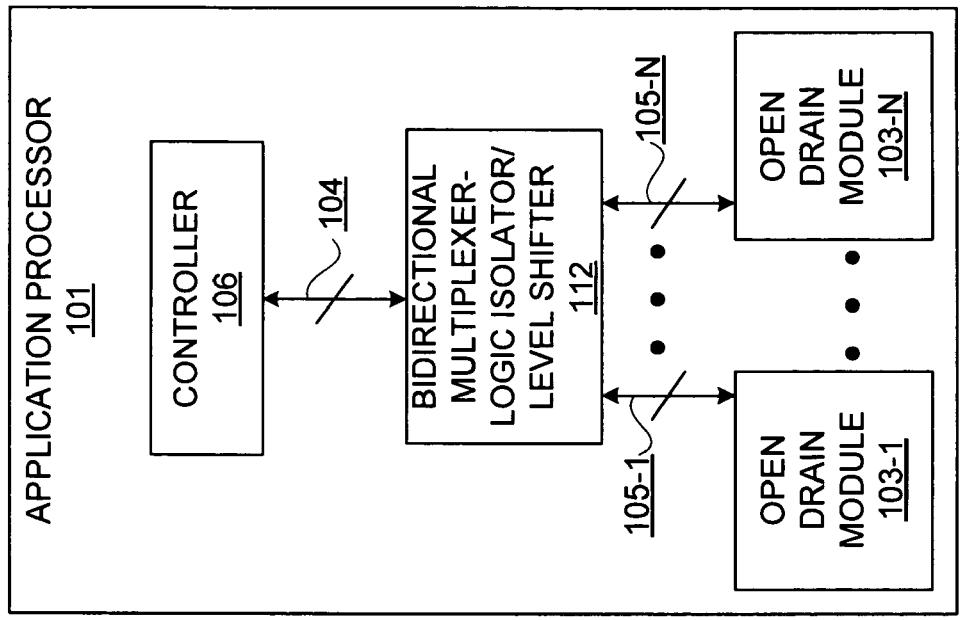
FIG. 1B is a block diagram depicting an alternative exemplary embodiment of an application processor.
Figure 1A:
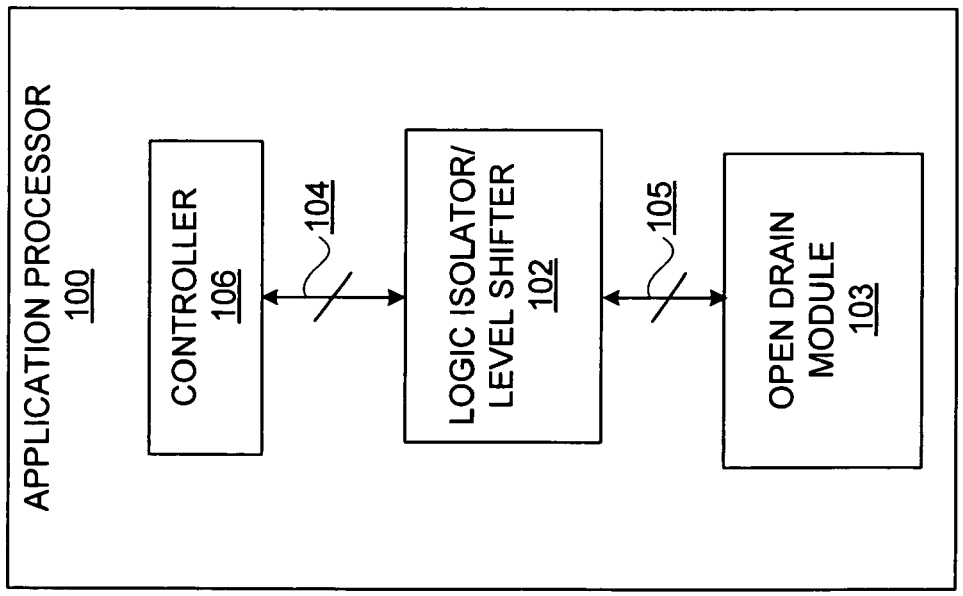
FIG. 1A is a block diagram depicting an exemplary embodiment of an application processor.

FIG. 1A is a block diagram depicting an exemplary embodiment of an application processor 100. Application processor 100 includes logic isolator/level shifter 102, open-drain module 103, and controller 106. For now, it shall be assumed that level shifting is done, and thus the term level shifter shall be used for level shifter 102. Notably, a single controller 106 may be implemented for controlling a single open-drain module 103. Controller 106 is coupled to level shifter 102 via internal bidirectional bus 104, and level shifter 102 is coupled to open-drain module via internal bidirectional bus 105. Level shifter 102 is described below in additional detail.

FIG. 1B is a block diagram depicting an exemplary embodiment of an application processor 101. Application processor 101 includes controller 106, a bidirectional multiplexer-logic isolator/level shifter 112, and open-drain modules 103-1 through 103-N, for N a positive integer greater than one. Notably, by bidirectional multiplexer, it is meant a multiplexing function in one direction of transfer of information and a demultiplexing function in another direction of transfer of information. Bidirectional multiplexing capability shall become more apparent for the following description. Moreover, logical isolation may generally follow from the ability to do level shifting. Thus, for now for purposes of clarity by way of example and not limitation, it shall be assumed that level shifting is done, and thus the term level shifter shall be used for level shifter 112. Notably, internal bidirectional buses 105-1 through 105-N respectively couple open-drain modules 103-1 through 103-N to level shifter 112. Level shifter 112 is coupled to a single controller 106 via internal bidirectional bus 104. Additional details regarding level shifter 112 are described below.

Notably, even though level shifters as described herein may be implemented in a single integrated circuit, such as application processor 100 of FIG. 1A or application processor 101 of FIG. 1B, it should be appreciated that level shifter 102 and level shifter 112 of FIGS. 1A and 1B respectively may be implemented as separate Application Specific Integrated Circuits ("ASICs") or Application Specific Standard Products ("ASSPs") or may be implemented as part of a PLD.

FIG. 2 is a block diagram depicting an exemplary embodiment of a level shifter system 200. Level shifter system 200 includes host integrated circuit ("IC") 201, level shifter 102, and an open-drain device, such as a Secure Digital ("SD") device 203. Notably, although an SD format is described for purposes of clarity by way of example, it should be appreciated that other open-drain formats may be used, such as MMC, I2C, SPI, and Microwire, among other known open-drain formats. IC 201 is a host integrated circuit with an open-drain format for input/output. Host IC 201 may be implemented as a microprocessor, ASIC, or ASSP. Level shifter 102 may be implemented as an ASIC or ASSP, or implemented in a PLD using programmable logic. Level shifter 102 may be implemented entirely or partially in programmable logic of a PLD, or such PLD may have dedicated logic for implementing a level shifter 102. Notably, level shifter 102 may be implemented in an FPGA or in a CPLD. As should be appreciated, a CPLD may have less variation in timing than an FPGA when placing a circuit. Accordingly, implementation of level shifter 102 in a CPLD may involve less attention to placement with respect to obtaining the desired timing for an application, which may vary from application to application. Host IC 201 may include a controller 333 for controlled communication with SD device 203. As controller 333 and SD device 203 are well-known devices, they, as well as communication therebetween, are not described herein in unnecessary detail.

Level shifter 102 may be coupled for communication with host IC 201 via an at least one external bus 204 and coupled for communication with SD devices 203 via at least one external bus 205. Notably, it should be appreciated that buses 204 and 205 may represent buses for a single channel, or multiple channels, for communication.

FIG. 3 is a block diagram depicting an exemplary embodiment of a level shifter system 300. Level shifter system 300 includes host IC 201, level shifter 112, and a plurality of open-drain devices, such as SD devices 203-1 through 203-N. Level shifter 112, like level shifter 102 of FIG. 2, may be implemented in a PLD, or as a separate ASIC or ASSP. Like level shifter 102 of FIG. 2, level shifter 112 may be coupled for communication with controller 333 of host IC 201 via an external bus 204. Level shifter 112 may be respectively coupled to SD devices 203-1 through 203-N via external buses 205-1 through 205-N (collectively "buses 205"). Again, it should be appreciated that buses 204 and 205 may represent buses for a single channel, or multiple channels, for communication.

Controller 333 of host IC 201 is configured to provide select signals 306-1 through 306-T, for T a positive integer greater than one, to level shifter 112. In this example, it is assumed that more than one select signal is used, as there are more than two SD devices 203-1 through 203-N. However, from the following example, it shall be shown that a single select signal may be used for two SD devices, such as SD device 203-1 and SD device 203-2 of FIG. 7. Accordingly, it should be appreciated that T may be less than N. Furthermore, it should be appreciated that host IC 201 may have a single controller 333 for communicating with more than one SD device 203-1 through 203-N via level shifter 112. Notably, host IC 201 communicates with only one SD device at a time, but may be coupled to more than one SD device at a time for multiplexed communication.

Figure 4:
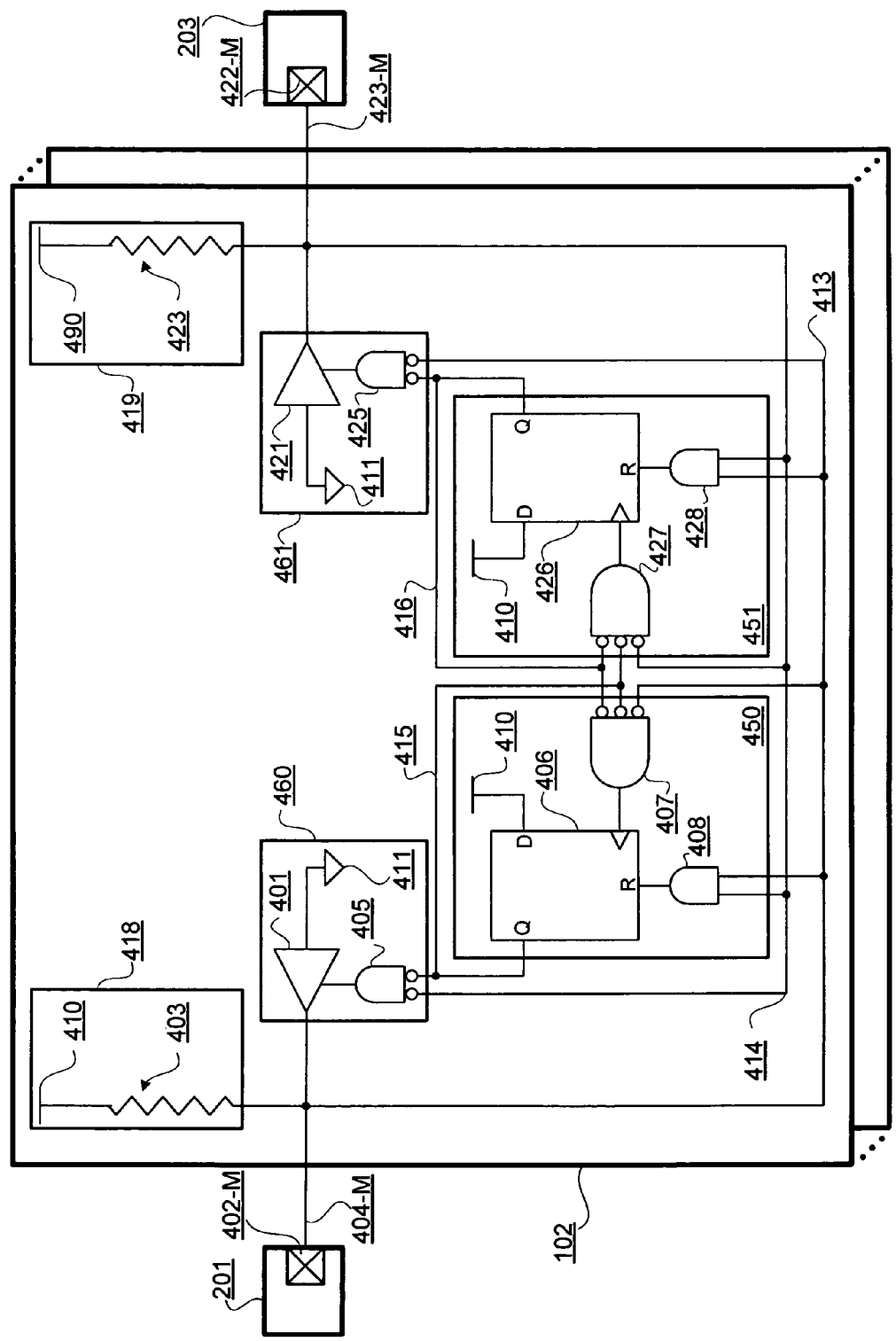
FIG. 4 is a circuit diagram depicting an exemplary embodiment of a level shifter, such as the level shifter of FIGS. 1A and 2, illustratively shown as part of the level shifter system of FIG. 2.

FIG. 4 is a circuit diagram depicting an exemplary embodiment of a level shifter, such as level shifter 102 of FIGS. 1A and 2. For purposes of clarity by way of example and not limitation, level shifter 102 is illustratively shown as part of level shifter system 200. Host IC 201 includes an input/output ("I/O") pad 402-M for M a positive integer. I/O pad 402-M is coupled to a trace 404-M. Trace 404-M may be part of an internal or external bus topology. Trace 404-M is coupled to I/O node 413 of level shifter 102. The use of "M" is to indicate there is at least one I/O pad and at least one trace; however, conventionally there are multiple I/O pads and traces, such as for bussed communication between integrated circuits. Accordingly, there may be M instances of level shifter 102.

SD device 203 includes an I/O pad 422-M. I/O pad 422-M is coupled to a trace 423-M of an internal or external bus topology. Trace 423-M is coupled to an I/O node 414 of level shifter 102. Notably, even though hardwiring of I/O nodes to I/O pads is illustratively described, it should be appreciated that over-the-air communication between host IC 201, level shifter 102, and SD device 203 may be used by including known radio and transceiver devices. However, for purposes of clarity by way of example and not limitation, hardwired connectivity shall be described.

Level shifter 102 includes pull-up voltage circuits 418 and 419. Pull-up voltage circuits 418 and 419 are what may be termed "weak pull-up" circuits. Pull-up voltage circuit 418 includes a resistor 403 coupled to a voltage source 410. Voltage source 410 may be at Vdd or Vcc. Notably, voltage level of voltage source 410 may be at or substantially the same as a logic high voltage level associated with host IC 201. Accordingly, voltage at I/O node 413, less some voltage drop due to resistor 403, may be generally a logic high voltage at a level associated with a logic high voltage level of host IC 201. For purposes of clarity by way of example and not limitation, it may be assumed that this voltage level for voltage source 410 is approximately 1.8 volts, although it should be appreciated that voltages less than or greater than 1.8 volts may be used. Furthermore, even though a resistor is illustratively shown for resistor 403, it should be appreciated that other devices, such as a transistor, may be configured for providing a resistance. Thus, resistor 403 is illustratively shown merely to indicate that a resistance may be used for weak pull-up voltage circuit 418.

Weak pull-up voltage circuit 419 includes a resistor 423 coupled to a voltage source 490. Voltage source 490 may be for a logic high voltage level like voltage source 410, except the logic voltage level is substantially different, such that voltage translation is employed for host IC 201 to communicate with SD device 203, and vice versa. The voltage level of voltage source 490 is associated with SD device 203, and may be a logic high voltage value. Accordingly, the voltage at I/O node 414 of level shifter 102 will be approximately the voltage level of voltage source 490 less any voltage drop across resistance, as indicated by resistor 423. Again, resistor 423, like resistor 403, may be implemented with devices other than resistors for providing a resistance value. For purposes of clarity by way of example and not limitation, it may be assumed that this voltage level for voltage source 490 is approximately 3.3 volts, although voltages less than or greater than 3.3 volts may be used subject to being substantially different than the voltage level of voltage source 410.

Level shifter 102 includes buffer circuit 460 and buffer circuit 461, as well as latch circuit 450 and latch circuit 451. Buffer circuit 460 includes tri-state buffer 401 having an input coupled to ground 411. Output of AND gate 405 is provided to a control port of tri-state buffer 401 for placing tri-state buffer 401 in either a tri-state condition or a voltage passing condition. Both inputs to AND gate 405 may be inverted. Buffer circuit 461 is configured like buffer circuit 460, namely with a tri-state buffer 421 having an input coupled to ground 411 and having a control port for setting either a tri-state or a voltage passing condition coupled to an output of an AND gate 425. Moreover, AND gate 425 may have its inputs inverted.

Output of buffer circuit 460 is coupled to I/O node 413, and output of buffer 421 is coupled to I/O node 414. I/O node 413 is coupled to an inverted input of AND gate 425, and I/O node 414 is coupled to an inverted input of AND gate 405.

Latch circuit 450 includes AND gate 408, register 406, and AND gate 407. AND gate 407 has its inputs inverted, and register 406 may be implemented as a flip-flop, which may be reset. Like latch circuit 450, latch circuit 451 includes a register 426, AND gate 428, and AND gate 427. AND gate 427 has its inputs inverted, and register 426 may be implemented as a resettable flip-flop. Data input to flip-flops 406 and 426 may be coupled to a logic high voltage level. In this example, a logic high voltage level associated with voltage source 410 is used as data inputs to flip-flops 406 and 426. Generally, the lower level of voltage sources 410 and 490 may be used as data inputs to flip-flops 406 and 426. More generally, even though level shifter 102 may have two different logic high voltage values, there may be a more generally used logic level voltage for operation, such as for operation of the digital CMOS circuits employed in level shifter 102 for example.

Output of flip-flop 406 is provided to interim node 415 and output of flip-flop 426 is provided to interim node 416. Interim node 415 is coupled to inverted inputs of AND gates 405, 407, and 427. Interim node 416 is coupled to other inverted inputs of AND gates 407 and 427, and an inverted input of AND gate 425. Still yet another inverted input of AND gate 407 is coupled to I/O node 413, and still yet another inverted input of AND gate 427 is coupled to I/O node 414. Thus, it should be appreciated that interim nodes 415 and 416 may be used to provide respective outputs of flip-flops 406 and 426 as a feed-forward voltage to buffer circuits 460 and 461, respectively, and a feedback voltage to latch circuits 450 and 451. For purposes of clarity and not limitation, voltages respectively output from flip-flops 406 and 426 are hereinafter simply referred to as "feedback voltages" even though they may be fed forward too.

An input of AND gate 408 is coupled to I/O node 413, and another input of AND gate 408 is coupled to I/O node 414. Output of AND gate 408 is provided to a reset port of flip-flop 406. An input of AND gate 428 is coupled to I/O node 413, and another input of AND gate 428 is coupled to I/O node 414. Output of AND gate 428 is provided to a reset port of flip-flop 426. Output of AND gate 407 is provided to a clock port of flip-flop 406, and output of AND gate 427 is provided to a clock port of flip-flop 426.

As shall become apparent from the following description, level shifter 102 may be used for transferring data from host IC 201 via I/O node 413 to SD device 203 via I/O node 414, and vice versa. Thus, level shifter 102 is a bidirectional level translator. Furthermore, it should be appreciated that direction of data flow is one direction at a time, namely from host IC 201 to SD device 203, or vice versa. As is known, control signaling or protocol, or both, may be used to indicate which of host IC 201 and SD device 203 is to communicate, such that both devices do not try to communicate at the same time. However, as shall be appreciated from the following description, level shifter 102 need not receive such control signaling, other than by receiving at least one falling edge or logic 0 as an initial input or value provided from the device, namely either host IC 201 or SD device 203, initiating a communication.

In order to better understand the operation of level shifter 102, an idle condition and operation with respect to level shifter 102 of level shifter system 200 are described. Notably, it is assumed that only one driver, namely only one of buffers 401 or 421, is active at a time.

Assuming host IC 201 is to communicate data or other information to SD device 203, host IC 201 begins by sending a logic 0 to I/O node 413. Prior to receiving such a logic 0, level shifter 102 may be in an idle state. In an idle state, output of AND gates 405 and 425 is logic 0, meaning associated tri-state buffers 401 and 421 are both in a tri-state condition. Thus, voltage at I/O nodes 413 and 414 are logic high values via pull-up voltage circuits 418 and 419, respectively. Accordingly, the output of AND gates 408 and 428 is a logic high value, holding flip-flops 406 and 426 in respective reset states. In a reset state or condition, flip-flops 406 and 426 are initialized to a logic 0 value. Thus, in such a condition, output of flip-flops 406 and 426 is a logic 0. The logic 0 output from flip-flops 406 and 426 coupled with the logic 1s on I/O nodes 413 and 414 as provided to inverted inputs, as previously described, of AND gates 405 and 425 respectively, means that output of each of those AND gates 405 and 425 is a logic 0. A logic 0 output from AND gates 405 and 425 holds tri-state buffers 401 and 421 in respective tri-state conditions.

For transitioning from an idle state to a level shifting state for communication, a logic 0 from host IC 201 received at I/O node 413 causes output of AND gate 408 as well as AND gate 428 to be a logic 0. A logic 0 output from AND gates 408 and 428 releases flip-flops 406 and 426 from their reset states.

The logic 0 provided at I/O node 413 is inverted by an inverted port of AND gate 407. As previously indicated, the outputs of flip-flops 406 and 426 are logic 0s, and thus switching one input of AND gate 407, namely the input coupled to I/O node 413, from a logic 1 to a logic 0 causes AND gate 407 to output a logic 1, as all inputs to AND gate 407 are inverted. A logic 1 output from AND gate 407 clocks flip-flop 406 which has been released from its reset state. Accordingly, the logic high value input to a data port of flip-flop 406 is clocked out of flip-flop 406 as a logic 1. This logic 1 output from flip-flop 406 is inverted along with the logic 1 of I/O node 414 by inverted ports of AND gate 405. Accordingly, output of AND gate 405 is a logic 0, and thus tri-state buffer 401 of buffer circuit 460 stays in a tri-state condition. This tri-state condition is latched because the output of flip-flop 406, being a logic 1 and fed back via interim node 415 to an inverted port of AND gate 407, causes the output of AND gate 407 for this feedback condition to be a logic 0. As flip-flop 406 is a leading-edge-triggered flip-flop, a logic 0, or namely a falling edge, disables flip-flop 406 from having the logic 1 output therefrom changed. In other words, flip-flop 406 is latched to provide a logic 1 to cause tri-state buffer 401 to stay tri-stated while data is transmitted from host IC 201.

The logic 0 leading information to be communication and provided to I/O node 413, while releasing flip-flop 426 from a reset state, does not change output from flip-flop 426. In other words, flip-flop 426 continues to output a logic 0, and thus the logic 0 output from flip-flop 426 is inverted by an inverted input port of AND gate 425 to be a logic 1. Furthermore, the leading logic 0 provided to I/O node 413 is provided to an inverted port of AND gate 425 as well, and thus output of AND gate 425 is a logic 1. The logic 1 output from AND gate 425 causes buffer 421 to go from a tri-state condition to a voltage passing condition. Thus, tri-state buffer 421 allows the voltage, such as a voltage associated with ground 411, to pass to override the weak pull-up voltage on node 414. In other words, node 414 goes from a logic high level to a logic low level. This logic low level appearing at node 414 is provided to I/O pad 422-M via trace 423-M to SD device 203. This communication leading logic 0 may be used to indicate to SD device 203 that host IC 201 wishes to communicate information to such SD device 203.

Thereafter, namely after an initial logic 0 input to node 413, the remainder or a second part of the input may be provided to I/O node 413 from host IC 201. This second part of the input may be a stream of data, including both logic 1s and logic 0s. Furthermore, it should be appreciated that the first part of the input, namely the leading logic 0, need not be a single logic 0, but may be a series of logic 0s as a flag to SD device 203 that data is coming from host IC 201.

Notably, subsequent logic 0s for communication following the communication leading logic 0, will be transferred from node 413 to node 414 via tri-state buffer 421, as previously described. For a logic 1 provided to I/O node 413 from host IC 201 for such communication, such logic 1 is inverted by an inverted port of AND gate 425 causing output of AND gate 425 to be a logic 0, whereas output of latch circuit 451 or more particularly output of flip-flop 426, stays a logic 0. As previously described, a logic 0 output from AND gate 425 causes tri-state buffer 421 to be put into a tri-state condition, and thus ground voltage 411 is not passed to I/O node 414. Rather, pull-up voltage provided via weak pull-up voltage circuit 419 is provided to I/O node 414 as a logic high value. For a logic 0 provided to I/O node 413 from host IC 201, such logic 0 is transferred to I/O node 414 as previously described. Thus, it should be appreciated that buffer circuit 461 may be toggled between a tri-state condition and a voltage passing condition responsive to a logic 1 and a logic 0, respectively, provided to I/O node 413 for transferring logic 1s and 0s from I/O node 413 to I/O node 414 for SD device 203.

Accordingly, because voltage transferred to I/O node 414 is a logic 0 by passing ground 411 through buffer 421 and is a logic 1 as associated with a logic high voltage level of voltage source 490, by tri-stating buffer 421, each of these logic levels may be respectively associated with logic low and logic high levels of an open-drain device, such as SD device 203. A logic 1 may be provided from host IC 201 to I/O node 413 by tri-stating an I/O pad 402-M of host IC 201. Thus, in contrast to driving a voltage, a logic 1 from host IC 201 is provided as associated with the logic high voltage level of voltage source 410, namely a weak pull-up voltage for an open-drain system. However, this weak pull-up voltage associated with weak pull-up voltage circuit 418 is translated to the weak pull-up voltage associated with weak pull-up voltage circuit 419 at I/O node 414 by tri-stating buffer 421. Again, the weak pull-up voltage of pull-up voltage circuit 419 may be associated with a logic high voltage level of SD device 203.

It has been assumed that weak pull-up voltage circuits 418 and 419 are internal to level shifter 102. However, either or both of such circuits 418 and 419 may be external to level shifter 102. Furthermore, even though the direction from host device 201 to SD device 203 was described, it should be appreciated that the reverse direction, namely initially providing one or more leading logic 0s to I/O node 414 followed by a data stream including logic 1s and 0s, is equally applicable. The only difference is that rather than translating the logic high voltage level associated with voltage source 410 to the logic high voltage level associated with voltage source 490, the reverse is true, namely the logic high voltage level associated with voltage source 490 is translated from I/O node 414 to the logic high voltage level associated with voltage source 410 on I/O node 413 by tri-stating buffer 401. As buffer circuits 460 and 461, as well as latch circuits 450 and 451, are logically symmetrical other than the logic high values as applied to nodes 413 and 414, repetitious description for the direction from SD device 203 to host IC 201 via level shifter 102 is avoided for purposes of clarity.

Figure 5A:
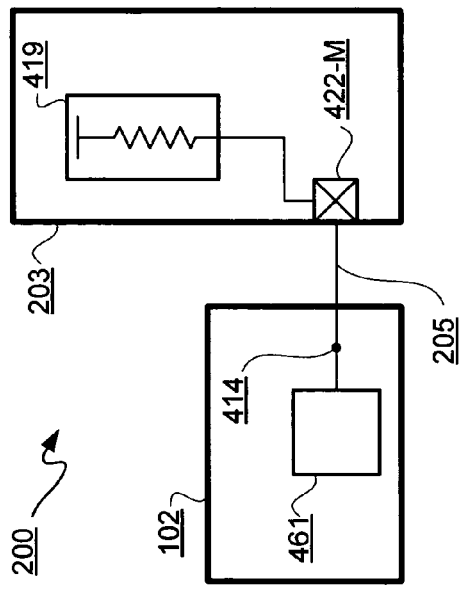
FIG. 5A is a block/circuit diagram depicting an alternative exemplary embodiment of a portion of the level shifter system of FIG. 2.

FIG. 5A is a block/circuit diagram depicting an alternative exemplary embodiment of a portion of a level shifter system 200. In this embodiment, in contrast to the embodiment of level shifter system 200 illustratively shown in FIG. 4, weak pull-up voltage circuit 418 is internal to host IC 201. Thus, resistor 403 of FIG. 4 may be coupled between a logic high voltage source 410 and an I/O pad 402-M of host IC 201. I/O pad 402-M may be coupled via a trace of an external bus 204 to I/O node 413 of level shifter 102.

Figure 5B:
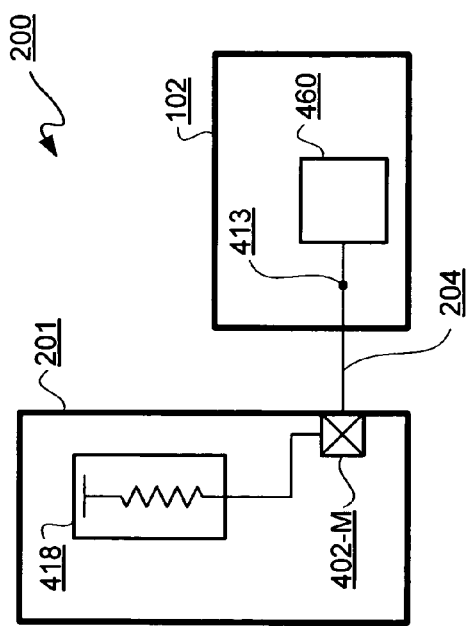
FIG. 5B is a block/circuit diagram depicting another alternative exemplary embodiment of a portion of the level shifter system of FIG. 2.

FIG. 5B is a block/circuit diagram depicting another alternative exemplary embodiment of a portion of level shifter system 200. In this embodiment, unlike the embodiment of level shifter system 200 of FIG. 4, weak pull-up voltage circuit 418 is shown as part of bus topology, namely part of external bus 204. Thus, an end of resistor 403 may be coupled to a trace of bus 204, where such trace couples pad 402-M to I/O node 413.

Figure 6A:
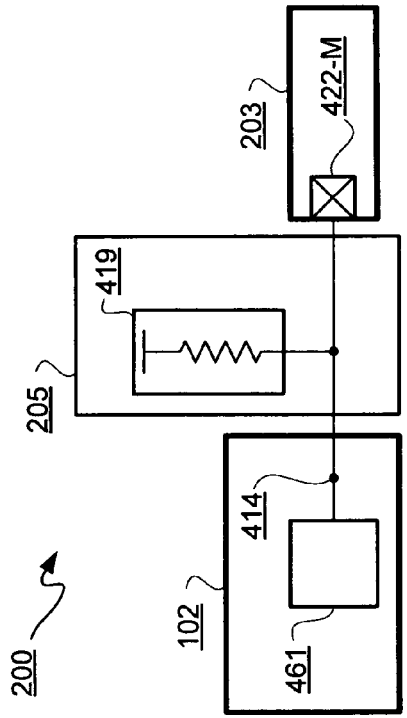
FIG. 6A is a block/circuit diagram depicting yet another alternative exemplary embodiment of a portion of the level shifter system of FIG. 2.

Likewise, FIG. 6A is a block/circuit diagram depicting yet another alternative exemplary embodiment of a portion of level shifter system 200. In this exemplary embodiment, weak pull-up voltage circuit 419 is internal to SD device 203. Accordingly, an end of resistor 423 of FIG. 4 may be coupled to I/O pad 422-M for coupling to I/O node 414 of level shifter 102.

Figure 6B:
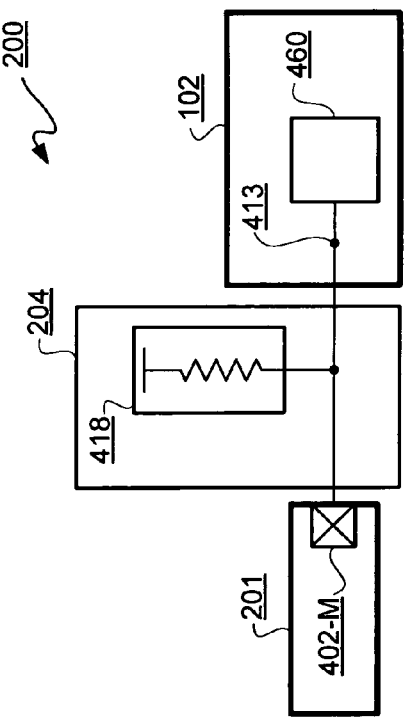
FIG. 6B is a block/circuit diagram depicting still yet another exemplary embodiment of a portion of the level shifter system of FIG. 2.

Furthermore, FIG. 6B is a block/circuit diagram depicting still yet another exemplary embodiment of a portion of a level shifter system 200. In this embodiment, weak pull-up voltage circuit 419 is part of bus topology, namely of external bus 205. Thus, an end of resistor 423 is coupled to a trace of bus 205, where such trace couples I/O node 414 to I/O pad 422-M.

As previously described, a logic 1, namely a leading edge, is provided to a clock port of a flip-flop, such as flip-flop 406 or 426, after a change in reset state, namely after flip-flops 406 and 426 are removed from their reset condition. Accordingly, it should be appreciated that in order to ensure timing, such as the clock occurring after reset as described, buffers may be added. Notably, adding buffers to compensate for propagation delays may vary in number and/or size from implementation to implementation, and accordingly such buffers are not shown here for purposes of clarity. Along those lines, however, it should be appreciated that timing associated with a CPLD may be more deterministic with respect to placement of level shifter 102 in comparison with such placement in an FPGA.

For an open-drain system, such as for an SD format, idle states are tri-stated. Thus, for example, when host IC 201 or SD device 203 is idle, outputs from respective pads 402-M and 422-M are tri-state conditions. Accordingly, voltages at nodes 413 and 414 are associated with logic high levels as respectively associated with pull-up voltage circuits 418 and 419 for host IC 201 and SD device 203 in an idle state. Again, it should be appreciated that to provide a logic 1 from host IC 201 to I/O node 413, host IC 201 may be tri-stated, which causes pull-up voltage circuit 418 to assert a logic 1 at node 413. Moreover, output from I/O pad 422-M of SD device 203 may be tri-stated to assert a logic 1 onto node 414 using weak pull-up voltage circuit 419.

Figure 7:
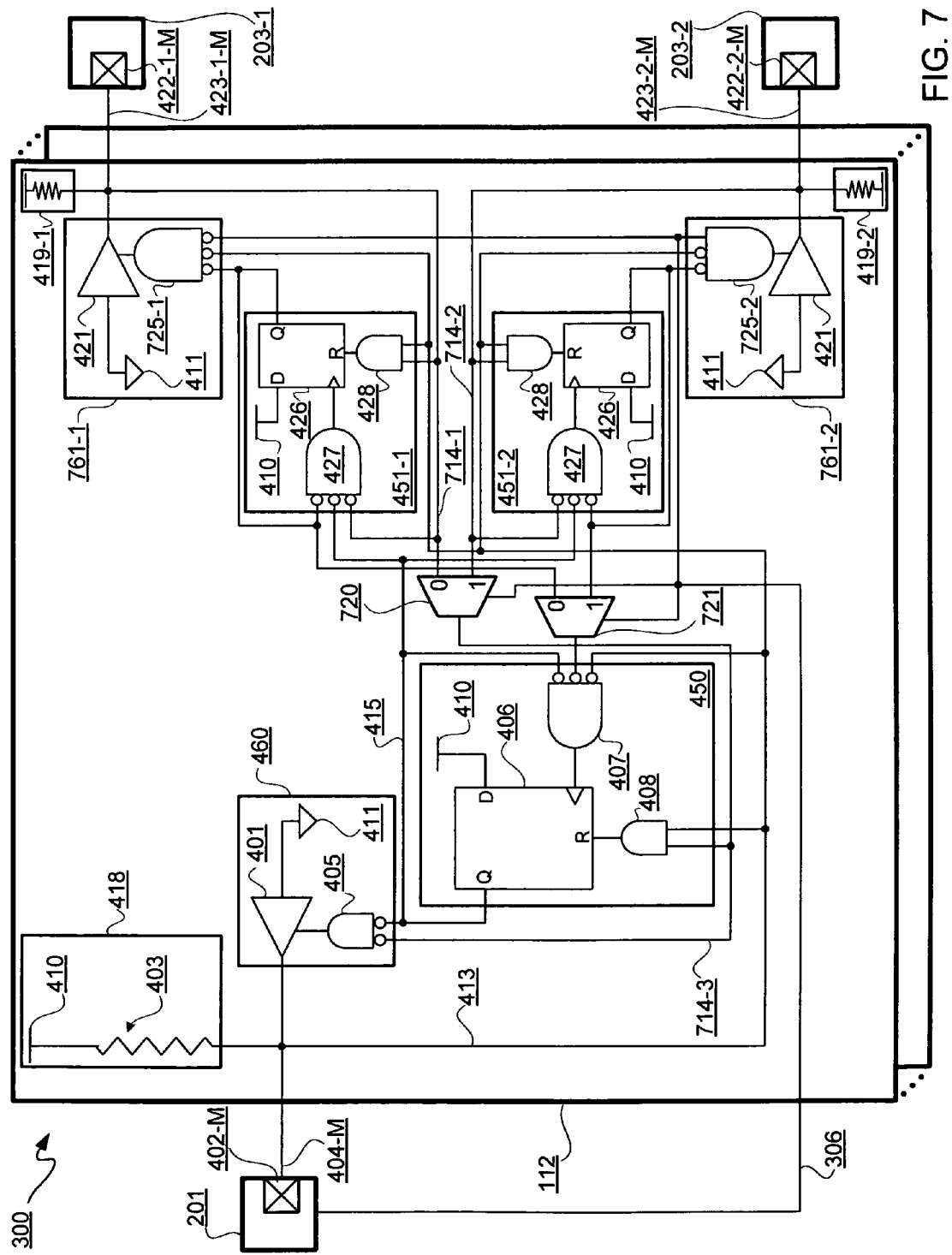
FIG. 7 is a block/circuit diagram depicting an exemplary embodiment of level shifter system of FIG. 3.

FIG. 7 is a block/circuit diagram depicting an exemplary embodiment of level shifter system 300 of FIG. 3. FIG. 7 is described with simultaneous reference to FIG. 3. Level shifter system 300 includes host integrated circuit 201, level shifter 112, and SD devices 203-1 and 203-2. Level shifter 112 is similar to level shifter 102 of FIG. 4 and thus for purposes of clarity only differences between the two are described.

In this particular example, two SD devices 203-1 and 203-2 are illustratively shown coupled to level shifter 112. However, it shall be appreciated from the description of two SD devices 203-1 and 203-2 coupled to level shifter 112 that more than two SD devices may be coupled to a level shifter 112. Level shifter 112 thus may be configured to handle additional devices in accordance with the description that follows of two SD devices coupled to level shifter 112. Furthermore, even though single level shifters 102 and 112 are shown in detail for the examples of FIGS. 4 and 7, respectively, for purposes of illustrating the coupling of individual traces, it should be appreciated that multiple instances of level shifters 102 and 112 may be used for supporting multiple traces of one or more bus topologies as generally indicated. Thus, for the example of SD devices 203-1 and 203-2, there may be separate buses 423-1 and 423-2 each having M traces. Notably, M bus lines of bus 404-M equally correspond to M level shifters 112; however, peripheral devices may use M or less than M traces for a bus depending on the signal protocol used. However, for purposes of clarity by way of example and not limitation, it shall be assumed that each SD device 203-1 and 203-2 uses M traces per bus, as generally designated as traces 423-1-M and 423-2-M. Correspondingly, M I/O pads 422-1-M and 422-2-M are respectively associated with SD devices 203-1 and 203-2.

In this example, host IC 201 is configured to provide a select signal 306 to control select ports of multiplexers 720 and 721, as well as to an inverted input of AND gate 725-1 and a non-inverted input of AND gate 725-2. Multiplexers 720 and 721 have been added to level shifter 102 to provide level shifter 112, and there are multiple buffer and latch circuits on the peripheral side of level shifter 112 for supporting multiple open-drain peripheral devices. Additionally, AND gates 725-1 and 725-2 replace AND gate 425 for each instance of a buffer circuit.

Associated with SD device 203-1 are latch circuit 451-1, buffer circuit 761-1, and pull-up voltage circuit 419-1, all of level shifter 112. Associated with SD device 203-2 are latch circuit 451-2, buffer circuit 761-2, and pull-up voltage circuit 419-2, all of level shifter 112. Again, pull-up voltage circuits may be internal or external with respect to level shifter 112, as previously described with reference to level shifter 102 of FIGS. 5A, 5B, 6A, and 6B. Notably, as multiplexers 720 and 721 are operated for a logic high voltage responsive to the logic high voltage level of pull-up voltage circuits 419-1 and 419-2, respectively, such multiplexers 720 and 721 may be configured to support such higher voltage levels, namely voltages higher than that associated with voltage source 410.

Latch circuits 451-1 and 451-2 respectively are logical equivalents of latch circuit 451 of FIG. 4. However, buffer circuits 761-1 and 761-2 each differ from buffer circuit 461 of FIG. 4 by replacing AND gate 425, which has two inputs, with AND gates 725-1 and 725-2, respectively, each of which has three inputs. Another difference is that the feedback output from respectively from flip-flop 426 of each latch circuit 451-1 and 451-2, in addition to being provided to an inverted port of an associated AND gate 427, is also provided as a respective data input to a multiplexer 721. For example, the feedback output from latch circuit 451-1 is provided to a logic 0 input port of multiplexer 721, and the feedback output from latch circuit 451-2 is provided to a logic 1 input port of multiplexer 721. Thus, it should be appreciated that a logic 0 is associated with selecting SD device 203-1 and a logic 1 is associated with selecting SD device 203-2, where such logic 0 and 1 may be provided via select signal 306.

Output of multiplexer 721 is coupled to an inverted input of AND gate 407. Thus, basically, the feedback outputs of latch circuits associated with SD devices are multiplexed to provide a selected one of them as an input to AND gate 407. Likewise, I/O nodes 714-1 and 714-2 are coupled to respective multiplexer input ports, namely a logic 0 input port and a logic 1 input port of multiplexer 720. Output of multiplexer 720 is coupled to I/O node 714-3. I/O node 714-3 replaces a host IC side portion of I/O node 414. I/O nodes 714-1 and 714-2 respectively associated with SD devices 203-1 and 203-2 are multiplexed for coupling to I/O node 714-3 as associated with host IC 201 side of level shifter 112. Thus, it should be appreciated that I/O node 414 is replaced by selectively coupling I/O node 714-3 to either I/O node 714-1 or 714-2 via multiplexer 720 responsive to state of select signal 306.

As for host IC 201 having one controller 333 for supporting multiple types of open-drain devices, multiple open-drain devices, such as SD devices 203-1 and 203-2, may communicate with a single host where level shifter 112 facilitates bidirectional multiplexed communication. For example, SD device 203-1 may be a memory card, and SD device 203-2 may be a wireless communication (e.g., 802.11) card. Memory may be read from and written to such a memory card by a host IC, and over-the-air communication may be received by or sent from the same host IC. Of course, these are just two examples, and other open-drain devices that may be used include multi-media cards, inter-integrated circuit bus applications, serial-peripheral interface applications including Microwire, and system management bus applications, among other known open-drain applications. Additionally, controller 333 of host IC 201 may be used in level shifter system 200 of FIG. 2 and thus level shifter 112 may replace level shifter 102. Notably, for level shifter 112 in system 200, select signal 306 in may be maintained for the selection of select SD device 203 or may be unused.

Assuming host IC 201 asserts a logic 0 via select signal 306 to level shifter 112, then SD device 203-1 is selected for communication in this example. Accordingly, host IC 201 is selecting either to receive or send data traffic to SD device 203-1. Conversely, if host IC 201 asserts a logic 1 via select signal 306 to level shifter 112, then for this example implementation, SD device 203-2 is selected for communication to or from host IC 201. Much of the prior description of the operation of level shifter 102 of FIG. 4 equally applies to the operation of level shifter 112, and thus is not repeated.

The input to AND gate 725-2 for receiving select signal 306 is not an inverted input. In contrast the input to AND gate 725-1 for receiving select signal 306 is an inverted input. All other inputs to AND gates 725-1 and 725-2 are inverted in accordance with the related description of AND gate 425 of FIG. 4. Thus, if a logic 0 is provided from host IC 201 via select signal 306 to buffer circuits 761-1 and 761-2, buffer circuit 761-1 may be toggled for communicating logic 1s and 0s in combination with pull-up voltage circuit 419-1 to SD device 203-1, whereas buffer circuit 761-2 will be held in a tri-state condition. Thus, a logic 0 provided to level shifter 112 via select signal 306 may be used to select SD device 203-1 for communication. Conversely, a logic 1 provided from host IC 201 via select signal 306 may be used to select SD device 203-2 for communication therewith.

If SD device 203-1, for example, is to communicate with host IC 201, and assuming that select signal 306 is set to a logic 0 for such communication, it should be appreciated that node 714-1 is electrically coupled to node 714-3 via multiplexer 720, where node 714-2 is not electrically coupled to node 714-3 via multiplexer 720. Conversely, if SD device 203-2 is to communicate with host IC 201, select signal 306 may be maintained at a logic 1 via an open-drain pull-up voltage such that node 714-2 is electrically coupled to node 714-3 via multiplexer 720, and node 714-1 is not electrically coupled to node 714-3 via multiplexer 720. Notably, the logic 1 asserted via select signal 306 may be an open-drain logic 1 or a driven logic 1.

It should be appreciated that by implementing in programmable logic a level shifter capable of handling more than one open-drain peripheral device, such level shifter implemented in a PLD may be scaled up or down depending on the number of open-drain peripherals to be supported. Furthermore, not all peripherals may use the same bus topology, and thus programmable logic, such as of a PLD for example, may be used to tailor level shifters to bus topology.

It should be appreciated that by having level shifters for communication between a host integrated circuit on one side and multiple peripheral integrated circuits on another side, a separate protocol need not be used to conform all peripherals to a same transport protocol. For example, rather than having to have a communication in a native protocol be wrapped in another protocol for communication, a native protocol to native protocol communication may be used where a host controller is configured to handle multiple different native protocols.

Notably, level shifting need not be used at all or may be used in combination with no level shifting. In the above example for purposes of clarity by way of example, a host voltage range of approximately 0 to 1.8 volts and a peripheral devices voltage range of approximately 0 to 3.3 volts have been assumed. However, different or same voltage ranges may be used within the scope of this disclosure. Moreover, not each peripheral device need have the same voltage range, as separate weak voltage pull-up circuits may be used for different peripheral devices.

However, for purposes of clarity by way of example, assume all peripheral devices and the host device have the same logic high voltage level, then a common weak voltage pull-up circuit or a same logic high voltage level as between peripheral side input/output nodes and a host side input/output node of logic isolators may be used. With reference to FIG. 4, voltage pull-up circuits 418 and 419 may be the same circuit or separate circuits used to provide a same logic high voltage level. In this configuration, no level shifting is done, but logic isolation as between host IC 201 and SD device 203 is provide by logic isolator 102.

Notably, logic isolator 102 may be employed with or without level shifting. However, in either configuration logic isolator 102 is auto-directional responsive to an initial logic 0 in the information sending device. Moreover, logic isolator is bidirectional.

With reference to FIG. 7, voltage pull-up circuits 418, 761-1 and 761-2 may not be the same circuit. However, voltage pull-up circuits 761-1 and 761-2 may be the same circuit or separate circuits used to provide a same logic high voltage level. In this configuration, no level shifting is done, but logic isolation as between host IC 201 and SD devices 203-1 and 203-2 is provided by logic isolator 112.

Notably, when logic isolator 112 is used for communicating from an SD device 203-1 or 203-2 to host IC 201, logic isolator 112 is in a multiplexing state. However, when logic isolator 112 is used for communicating from host IC 201 to an SD device 203-1 or 203-2, logic isolator 112 is in a demultiplexing state. In other words, communication traffic from a peripheral integrated circuit is multiplexed to a host integrated circuit; however, communication traffic from a host device to a peripheral integrated circuit involves selectively having only one buffer circuit at a time conditioned for communicating traffic. For example, by having only one of buffer circuits 761-1 and 761-2 of logic isolator 112 in a condition for communicating traffic while holding or maintaining the other of the buffer circuits 761-1 and 761-2 in a tri-state mode, logic isolator in effect provides demultiplexing from host IC 201 to SD devices 203-1 and 203-2. Again, even though only two SD devices are illustratively shown, it should be appreciated that all unselected buffer circuits are held in a tri-state mode, while a selected buffer circuit is put in a condition for communicating traffic.

Figure 8A:
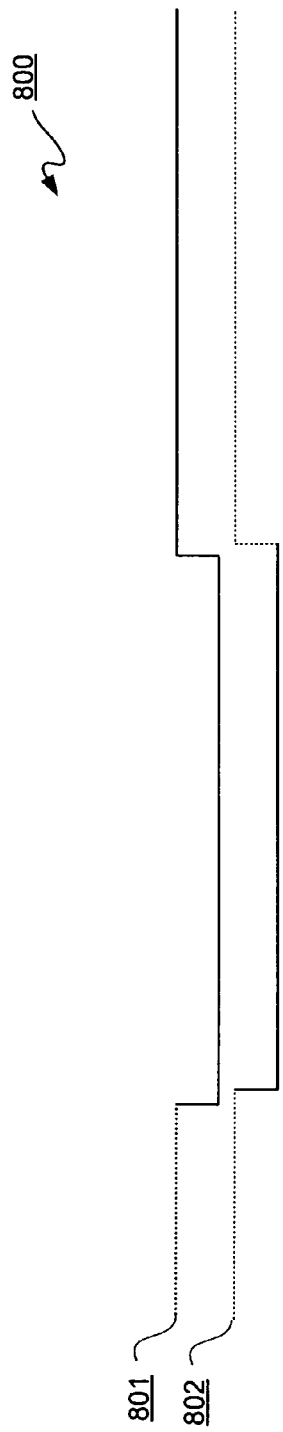
FIG. 8A is a signal diagram depicting an exemplary embodiment of signal timing.

FIG. 8A is a signal diagram depicting an exemplary embodiment of signal timing 800. For signal timing 800, a host IC drives a signal to an SD device such as in level shifter system 200 of FIG. 2. More particularly, signal 801 may be applied to node 413. Dashed lines of signals in FIGS. 8A, 8B, and 9 indicate a tri-stated weak pull-up voltage, and solid lines of signals in FIGS. 8A, 8B, an 9 indicate driving a voltage using a ground. This is consistent with an open-drain circuit, where a tri-state is used to transition from a logic low or to maintain a logic high state, and a non-tri-state, namely a driving condition, is used where a ground pulls a voltage from a logic high to a logic low or maintains a logic low condition.

Figure 8B:
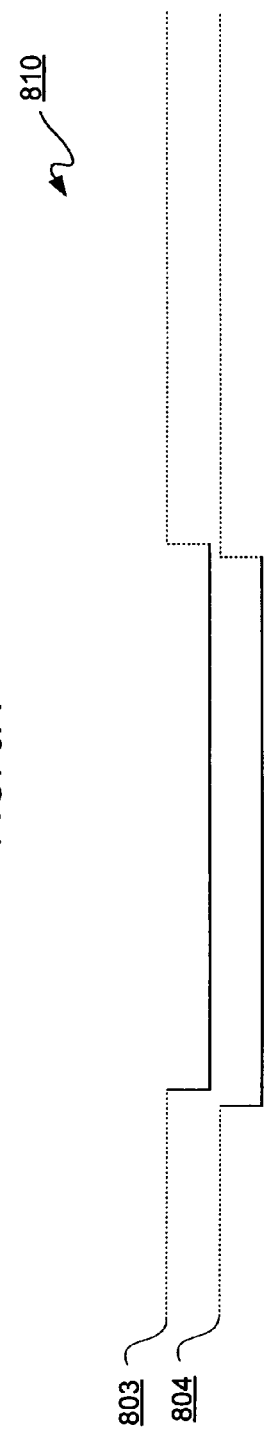
FIG. 8B is a signal diagram depicting an alternative exemplary embodiment of signal timing.
Figure 9:
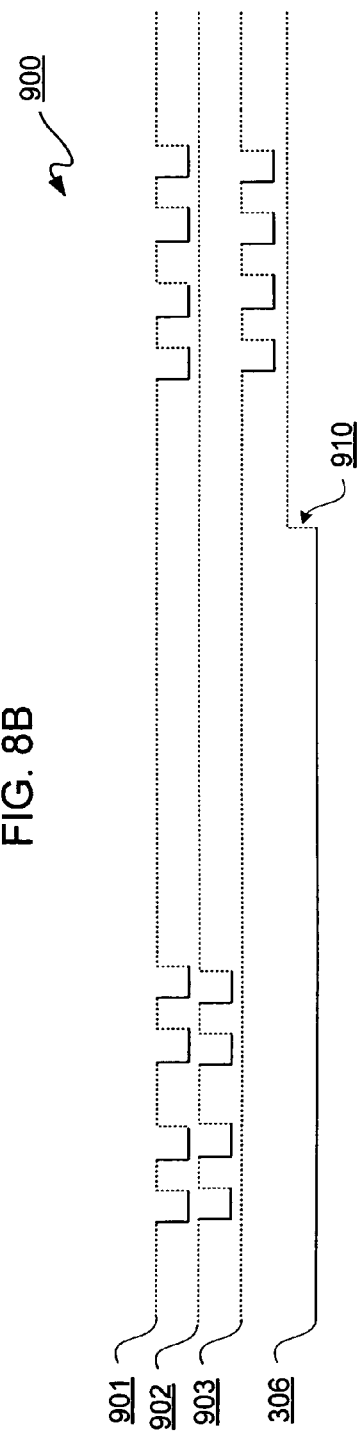
FIG. 9 is a signal diagram depicting another alternative exemplary embodiment of signal timing.

Signal 802 is in response to signal 801, and appears at I/O node 414. In this example, host IC 201 provides a signal 801 to I/O node 413 of level shifter 102 for translation to I/O node 414 for SD device 203. In the examples of FIGS. 8A, 8B, and 9, it has been assumed that no logic level shifting is done. However, voltages levels may be scaled for logic level shifting in these examples without departure from the scope of this disclosure.

FIG. 8B is a signal diagram depicting an exemplary embodiment of signal timing 810. More particularly, in this example, a signal 803 is provided at node 414 from SD device 203 to level shifter 102 for translation to node 413 for host IC 201. In this example, signal 804 appears at node 413 for host IC 201 in response to signal 803 being level shifted by level shifter 102.

FIG. 9 is a signal diagram depicting an exemplary embodiment of signal timing 900. Signal timing 900 is for selecting between SD devices 203-1 and 203-2 of FIG. 7. For select signal 306 being in a logic low state, signal 901 from host IC 201 provided to node 714-3 is translated to node 714-1 for output of signal 902 on node 714-1 for SD device 203-1. In other words, signal 901 is level shifted by level shifter 112 to provide signal 902. Notably, while select signal 306 is a logic low state, signal 903 at node 714-2 is held at a logic high state by weak pull-up voltage circuit 419-2. After select signal 306 transitions from a logic low to a logic high state generally at 910, signal 901 is translated from node 714-3 to node 714-2 of level shifter 112 to provide signal 903. In other words, for select signal 306 being a logic high value, signal 901 is level shifted to provide signal 903. Notably, signal 902 at node 714-1 is held at a logic high value by weak pull-up voltage circuit 419-1 while select signal 306 is at a logic high value. The reverse direction of communication, namely from either SD device 203-1 or 203-2, to host IC 201 follows from the above description.

Accordingly, it should be understood that a logic isolator has been described that may be used with or without level shifting or a combination thereof. With respect to the level shifting and no level shifting configuration, a host side weak pull-up voltage circuit would have a same logic high voltage level with at least one peripheral side weak pull-up voltage circuit, and in some instances the same circuit may be used for both. Moreover, with respect to the level shifting and no level shifting configuration, the host side weak pull-up voltage circuit would have a significantly different logic high voltage level with at least one peripheral side weak pull-up voltage circuit, and in some instances the at least one peripheral side weak pull-up voltage circuit may shared in associations with peripheral integrated circuits. Furthermore, it should be appreciated that logic isolator is bidirectional without having a directional control bit external from a data stream to be passed therethough.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A logic isolation circuit, comprising:
a first buffer circuit configured for being switched between a first voltage transferable state and a first voltage non-transferable state;
a first latch circuit configured for being switched between a first reset state and a first non-reset state, the first reset state for setting the first latch circuit to a first reset condition;
a first input/output node coupled to receive a first logic level voltage;
a second buffer circuit configured for being switched between a second voltage transferable state and a second voltage non-transferable state;
a second latch circuit configured for being switched between a second reset state and a second non-reset state, the second reset state for setting the second latch circuit to a second reset condition;
a second input/output node coupled to receive a second logic level voltage;
the first logic level voltage and the second logic level voltage both being for a same logic state;
the first buffer circuit coupled to the first input/output node and the second input/output node;
the second buffer circuit coupled to the first input/output node and the second input/output node;
the first latch circuit coupled to the first buffer circuit, the second latch circuit, the first input/output node, and the second input output node;
the second latch circuit coupled to the second buffer circuit, the first latch circuit, the first input/output node, and the second input output node;
the first buffer circuit configured to provide a first override voltage to the first input/output node when in the first voltage transferable state, the first override voltage for overriding the first logic level voltage; and
the first buffer circuit configured to not provide the first override voltage to the first input/output node when in the first voltage non-transferable state.

2. The logic isolation circuit according to claim 1, wherein the second logic level voltage is substantially different from the first logic level voltage.

3. The logic isolation circuit according to claim 1, wherein the second logic level is at least substantially equivalent to the first logic level voltage.

4. The logic isolation circuit according to claim 1, further comprising:
the second buffer circuit configured to provide a second override voltage to the second input/output node when in the second voltage transferable state, the second override voltage for overriding the second logic level voltage; and
the second buffer circuit configured to not provide the second override voltage to the second input/output node when in the second voltage non-transferable state.

5. The logic isolation circuit according to claim 4, further comprising:
the first latch circuit configured to put the first buffer circuit in the first voltage non-transferable state responsive to the first latch circuit being in the first reset state;
the second latch circuit configured to put the second buffer circuit in the second voltage non-transferable state responsive to the second latch circuit being in the second reset state;
the first latch circuit configured to maintain the first buffer circuit in the first voltage non-transferable state responsive to a first external input provided to the first input/output node and configured to provide a first feed-forward/feedback signal responsive to the first external input;
the second latch circuit coupled to receive the first feed-forward/feedback signal from the first latch circuit;
the second latch circuit configured to put the second buffer circuit in a first data transfer mode responsive to the first feed-forward/feedback signal maintaining the second latch circuit in the second reset condition;
the second buffer circuit capable of being switched between the second voltage transferable state and the second voltage non-transferable state responsive to a second external input provided to the first input/output node for transferring the second external input to the second input/output node via the second buffer circuit; and
the first buffer circuit and the second buffer circuit being configured for open-drain operation.

6. The logic isolation circuit according to claim 5, wherein the first logic level voltage and the second logic level voltage are provided from logic level circuitry external to the logic isolation circuit.

7. The logic isolation circuit according to claim 5, wherein the first logic level voltage and the second logic level voltage are provided from logic level circuitry internal to the logic isolation circuit.

8. The logic isolation circuit according to claim 5, further comprising:
the second latch circuit configured to return the second buffer circuit to the second voltage non-transferable state responsive to a third external input provided to the second input/output node and configured to provide a second feed-forward/feedback signal responsive to the third external input;
the first latch circuit coupled to receive the second feed-forward/feedback signal from the second latch circuit;
the first latch circuit configured to put the first buffer circuit in a second data transfer mode responsive to the second feed-forward/feedback signal maintaining the first latch circuit in the first reset condition; and
the first buffer circuit capable of being switched between the first voltage transferable state and the first voltage non-transferable state responsive to a fourth external input provided to the second input/output node for transferring the fourth external input to the first input/output node via the first buffer circuit.

9. The logic isolation circuit according to claim 8, wherein the first external input and the third external input which respectively trigger the first data transfer mode and the second data transfer mode are mutually exclusive, the first data transfer mode for transfer of the second external input from the first input/output node to the second input/output node via the logic isolation circuit, the second data transfer mode for transfer of the fourth external input from the second input/output node to the first input/output node via the logic isolation circuit, the logic isolation circuit capable of bidirectional transfer of data wherein the second external input and the fourth external input are respective data streams.

10. The logic isolation circuit according to claim 9, wherein the logic isolation circuit is configured for data transfer between the first input/output node and the second input/output node responsive to the first external input and the third external input respectively applied thereto.

11. The logic isolation circuit according to claim 5, further comprising:
a first select circuit and a second select circuit coupled for receiving a select signal;
a third buffer circuit configured for being switched between a third voltage transferable state and a third voltage non-transferable state;
a third latch circuit configured for being switched between a third reset state and a third non-reset state, the third reset state for setting the third latch circuit to a third reset condition;
a third input/output node coupled to receive a third logic level voltage;
the first buffer circuit, the second buffer circuit, and the second buffer circuit all being configured for open-drain operation;
the logic isolation circuit for providing multiplexing capability in a first direction of communication via the first buffer with the second buffer and the third buffer respectively held in the second voltage non-transferable state and the third voltage non-transferable state; and
the logic isolation circuit further for providing demultiplexing capability in a second direction of communication via a selected one of the second buffer circuit and the third buffer circuit wherein an unselected one of the second buffer circuit and the third buffer circuit is held in an associated one of the second voltage non-transferable state and the third voltage non-transferable state.

12. The isolation circuit according to claim 11, wherein the first logic level voltage, the second logic level voltage and the third logic level voltage all being for the same logic state but at least one of the second logic level voltage and the third logic level voltage being substantially greater than the first logic level voltage.

13. The isolation circuit according to claim 11, wherein the first logic level voltage, the second logic level voltage and the third logic level voltage all being for the same logic state but at least one of the second logic level voltage and the third logic level voltage being at least substantially equivalent to the first logic level voltage.

14. The logic isolation circuit according to claim 11, further comprising:
the third buffer circuit coupled to the first input/output node and the third input/output node;
the third buffer circuit configured to provide a third override voltage to the third input/output node when in the third voltage transferable state, the third override voltage for overriding the third logic level voltage;

the third buffer circuit configured to not provide the third override voltage to the third input/output node when in the third voltage non-transferable state;

the third latch circuit configured to put the third buffer circuit in the third voltage non-transferable state responsive to the third latch circuit being in the third reset state;

the second latch circuit and the third latch circuit each coupled to the first latch circuit for receiving the first feed-forward/feedback signal therefrom;

the second latch circuit configured to provide a second feed-forward/feedback signal;

the third latch circuit configured to provide a third feed-forward/feedback signal;

the second buffer circuit coupled to receive the second feed-forward/feedback signal;

the third latch circuit coupled to receive the third feed-forward/feedback signal;

the first select circuit coupled to receive the second feed-forward/feedback signal and the third feed-forward/feedback signal, the first select signal configured to select between the second feed-forward/feedback signal and the third feed-forward/feedback signal responsive to the select signal for providing to the first latch circuit;

the second input/output node further coupled to the second select circuit;

the third input/output node coupled to the third buffer circuit, the third latch circuit, and the second select circuit; and the second select circuit configured to provide signaling from either the second input/output node or the third input/output node to the first latch circuit and the first buffer circuit responsive to the select signal.

15. A system for bidirectional communication between a host integrated circuit and one or more peripheral integrated circuits, the system comprising:

a logic isolator coupled between the host integrated circuit and the one or more peripheral integrated circuits;

the host integrated circuit configured to provide a select signal for selecting one of the one or more peripheral integrated circuits for communication;

the logic isolator configurable to be in a first transfer mode for transferring first information from the host integrated circuit to the one of the one or more peripheral integrated circuits;

the logic isolator put in the first transfer mode responsive to a leading portion of the first information;

the logic isolator further configurable to be in a second transfer mode for transferring second information from the one of the one or more peripheral integrated circuits to the host integrated circuit, the second transfer mode being mutually exclusive with respect to the first transfer mode; and the logic isolator put in the second transfer mode responsive to a leading portion of the second information;

wherein the logic isolator is bidirectional responsive to the leading portion respectively associated with the first information and the second information.

16. The system according to claim 15, wherein the first transfer mode is associated with a demultiplexing function; and wherein the second transfer mode is associated with a multiplexing function.

17. The system according to claim 15, further comprising:

the host integrated circuit associated with a host bus of a first voltage range;

the one or more peripheral integrated circuits associated with one or more peripheral buses of at least one second voltage range;

the logic isolator coupled to the host integrated circuit via the host bus and coupled to the one or more peripheral integrated circuits via the one or more peripheral buses, the logic isolator including multiple logic isolation circuits, each of the logic isolation circuits including:

a first buffer circuit configured for being switched between a first voltage transferable state and a first voltage non-transferable state;

a first latch circuit configured for being switched between a first reset state and a first non-reset state, the first reset state for setting the first latch to a first reset condition;

a first input/output node coupled to receive a first logic level voltage;

a second buffer circuit configured for being switched between a second voltage transferable state and a second voltage non-transferable state;

a second latch circuit configured for being switched between a second reset state and a second non-reset state, the second reset state for setting the second latch to a second reset condition;

a second input/output node coupled to receive a second logic level voltage;

the first logic level voltage and the second logic level voltage both being for a same logic state;

a first select circuit and a second select circuit coupled for receiving a select signal;

a third buffer circuit configured for being switched between a third voltage transferable state and a third voltage non-transferable state;

a third latch circuit configured for being switched between a third reset state and a third non-reset state, the third reset state for setting the third latch to a third reset condition;

a third input/output node coupled to receive a third logic level voltage; and the first logic level voltage, the second logic level voltage, and the third logic level voltage all being for the same logic state.

18. The system according to claim 17, wherein the logic isolation circuits are configurable for no level shifting, level shifting, or a combination of no level shifting and level shifting for transfer of communication traffic between the host integrated circuit and the one or more peripheral integrated circuits.

19. The system according to claim 17, wherein the host bus and the one or more peripheral buses are each for open-drain busing.

20. The system according to claim 17, wherein the logic isolation circuits are instantiated at least in part in programmable logic of a programmable logic device.

* * * * *